United States Patent
Koyama

(10) Patent No.: US 9,691,677 B2
(45) Date of Patent: Jun. 27, 2017

(54) UNDERFILL MATERIAL AND METHOD FOR MANUFACTURING SEMICONDUCTOR DEVICE USING THE SAME

(71) Applicant: DEXERIALS CORPORATION, Tokyo (JP)

(72) Inventor: Taichi Koyama, Tochigi (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/423,821

(22) PCT Filed: Sep. 10, 2014

(86) PCT No.: PCT/JP2014/073963
§ 371 (c)(1),
(2) Date: Feb. 25, 2015

(87) PCT Pub. No.: WO2015/037632
PCT Pub. Date: Mar. 19, 2015

(65) Prior Publication Data
US 2015/0348858 A1    Dec. 3, 2015

(30) Foreign Application Priority Data

Sep. 11, 2013   (JP) ................................. 2013-188291

(51) Int. Cl.
*H01L 23/29*    (2006.01)
*H01L 21/56*    (2006.01)
(Continued)

(52) U.S. Cl.
CPC .............. *H01L 23/293* (2013.01); *C08J 5/18* (2013.01); *C09J 133/04* (2013.01); *C09J 163/08* (2013.01);
(Continued)

(58) Field of Classification Search
CPC .......... H01L 23/29; H01L 23/00; H01L 21/56; H01L 23/3735; H01L 23/485; H01L 23/488; H01L 23/49513
(Continued)

(56) References Cited

U.S. PATENT DOCUMENTS

2005/0008873 A1* 1/2005 Noro ....................... B32B 27/08
                                                                    428/423.1
2008/0165518 A1* 7/2008 Ichiryu et al. ................. 361/803
(Continued)

FOREIGN PATENT DOCUMENTS

JP   2000-306955 A   11/2000
JP   2005-028734 A    2/2005
(Continued)

OTHER PUBLICATIONS

Dec. 2, 2014 Search Report issued in International Application No. PCT/JP2014/073963.

*Primary Examiner* — Chuong A Luu
*Assistant Examiner* — Rodolfo D Fortich
(74) *Attorney, Agent, or Firm* — Oliff PLC

(57) ABSTRACT

An underfill material enabling voidless packaging and excellent solder bonding properties, and a method for manufacturing a semiconductor device using the same are provided. An underfill material, including an epoxy resin, an acid anhydride, an acrylic resin, and an organic peroxide, the minimum melt viscosity being between 1000 Pa*s and 2000 Pa*s, and gradient of melt viscosity between 10° C. higher than the minimum melt viscosity attainment temperature and a temperature 10° C. higher being between 900 Pa*s/° C. and 3100 Pa*s/° C., is applied to a semiconductor chip having a solder-tipped electrode formed thereon, and the semiconductor chip is mounted onto a circuit substrate having a counter electrode opposing the solder-tipped electrode, and the semiconductor chip and the circuit substrate (Continued)

are thermocompressed under bonding conditions of raising the temperature from a first temperature to a second temperature at a predetermined rate.

4 Claims, 7 Drawing Sheets

(51) Int. Cl.
  *C08J 5/18* (2006.01)
  *C09J 133/04* (2006.01)
  *C09J 163/08* (2006.01)
  *H01L 23/00* (2006.01)
  *H01L 21/683* (2006.01)

(52) U.S. Cl.
  CPC ........ *H01L 21/563* (2013.01); *H01L 21/6836* (2013.01); *H01L 24/81* (2013.01); *C08J 2333/16* (2013.01); *C08J 2363/02* (2013.01); *C08J 2433/16* (2013.01); *C08J 2463/02* (2013.01); *H01L 2221/68327* (2013.01); *H01L 2221/68377* (2013.01); *H01L 2224/16225* (2013.01); *H01L 2224/32225* (2013.01); *H01L 2224/73104* (2013.01); *H01L 2224/73204* (2013.01); *H01L 2224/81191* (2013.01); *H01L 2224/81203* (2013.01); *H01L 2224/83191* (2013.01); *H01L 2924/00011* (2013.01); *H01L 2924/01322* (2013.01); *H01L 2924/06* (2013.01); *H01L 2924/0635* (2013.01); *H01L 2924/0665* (2013.01); *H01L 2924/186* (2013.01); *H01L 2924/20102* (2013.01); *H01L 2924/20103* (2013.01); *H01L 2924/20104* (2013.01)

(58) Field of Classification Search
  USPC .................. 438/126, 460, 124, 125, 127
  See application file for complete search history.

(56) References Cited

U.S. PATENT DOCUMENTS

2011/0243786 A1   10/2011   Murakami et al.
2012/0248632 A1*  10/2012   Mitsukura ............. C09J 7/0203
                                                              257/787

FOREIGN PATENT DOCUMENTS

| JP | 2009-239138 A | 10/2009 |
| JP | 2011-243786 A | 12/2011 |
| JP | 2012-124244 | 6/2012 |
| WO | 2009/041235 A1 | 4/2009 |
| WO | 2013/080708 A1 | 6/2013 |

* cited by examiner

UNDERFILL MATERIAL AND METHOD FOR MANUFACTURING SEMICONDUCTOR DEVICE USING THE SAME

TECHNICAL FIELD

This invention relates to an underfill material used for mounting a semiconductor chip and a method for manufacturing a semiconductor device using the same. This application claims priority to Japanese Patent Application No. 2013-188291, filed on Sep. 11, 2013, the entire content of which is incorporated herein by reference.

BACKGROUND ART

In recent years, with an object of shortening processes related to mounting methods of semiconductor chips, the use of pre-applied underfill film (PUF) wherein an underfill film is applied to electrodes of an integrated circuit (IC) has been investigated.

Mounting methods using this pre-applied underfill film are, for example, performed in the following manner (For example, refer to PTL 1).

Step A: An underfill film is applied to a wafer and the wafer is diced to obtain a semiconductor chip(s).

Step B: The semiconductor chip is aligned on the substrate.

Step C: The semiconductor chip and substrate are crimped together by using a high temperature and a high pressure, electrical conduction is ensured using metallic bonding of solder bumps, and the semiconductor chip is bonded to the substrate by curing of the underfill film.

Because conventional underfill films are formed using a single curing agent, fine control of behavior thereof from a molten state to a cured state is difficult and adaptation of behavior thereof from molten state to cured state to conditions of actual flip-chip bonding has not been possible. As a result, voids are generated and, moreover, bonding defects such as resin entering between bumps occur.

PRIOR ART LITERATURE

Patent Literature

PTL 1 Japanese Unexamined Patent Publication No. 2005-28734

SUMMARY OF THE INVENTION

Problem to be Solved by the Invention

In view of the foregoing, an object of this invention is to provide an underfill film material and a method for manufacturing a semiconductor device using the same which enables voidless mounting and favorable solder bonding properties.

Means for Solving the Problem

In order to solve the aforementioned problem, the present invention provides an underfill material used under a bonding condition in which a temperature is increased at a predetermined rate from a first temperature to a second temperature, wherein the underfill material contains an epoxy resin, an acid anhydride, an acrylic resin and an organic peroxide, minimum melt viscosity of the underfill material ranges from 1000 Pa*s to 2000 Pa*s, and gradient of the melt viscosity from a temperature 10° C. higher than a minimum melt viscosity attainment temperature to a temperature 10° C. higher than the temperature ranges 900 Pa*s/° C. to 3100 Pa*s/° C.

Additionally, a manufacturing method of a semiconductor device of the present invention includes a mounting step of mounting a semiconductor chip onto an electronic component, the semiconductor chip having a solder-tipped electrode formed thereon and an underfill material applied to the surface of the electrode, and the electronic component having a counter electrode facing the electrode, and a thermocompression bonding step of thermally compressing the semiconductor chip and the electronic component by increasing a temperature at a predetermined rate from a first temperature to a second temperature, wherein the underfill material contains an epoxy resin, an acid anhydride, an acrylic resin and an organic peroxide, minimum melt viscosity of the underfill material ranges from 1000 Pa*s to 2000 Pa*s, and gradient of the melt viscosity from a temperature 10° C. higher than a minimum melt viscosity attainment temperature to a temperature 10° C. higher than the temperature ranges 900 Pa*s/° C. to 3100 Pa*s/° C.

Effects of the Invention

Since the underfill material according to the present invention has a predetermined minimum melt viscosity and a predetermined gradient of viscosity above the temperature at which the underfill material reaches minimum melt viscosity (minimum melt viscosity attainment temperature), the underfill material is appropriate to bonding conditions in which temperature is increased from a first temperature to a second temperature at a predetermined rate thus enabling voidless mounting and excellent solder bonding properties.

DESCRIPTION OF THE EMBODIMENTS

Embodiments of the present invention will be described in detail below in the following order.
1. Underfill Material
2. Method for Manufacturing Semiconductor Device
3. Examples
1. Underfill Material An underfill material according to this embodiment is applied to a semiconductor chip, on which a solder-tipped electrode has been formed, before the semiconductor chip is mounted to an electrical component having a counter solder-tipped electrode formed thereon.

Figure 1:
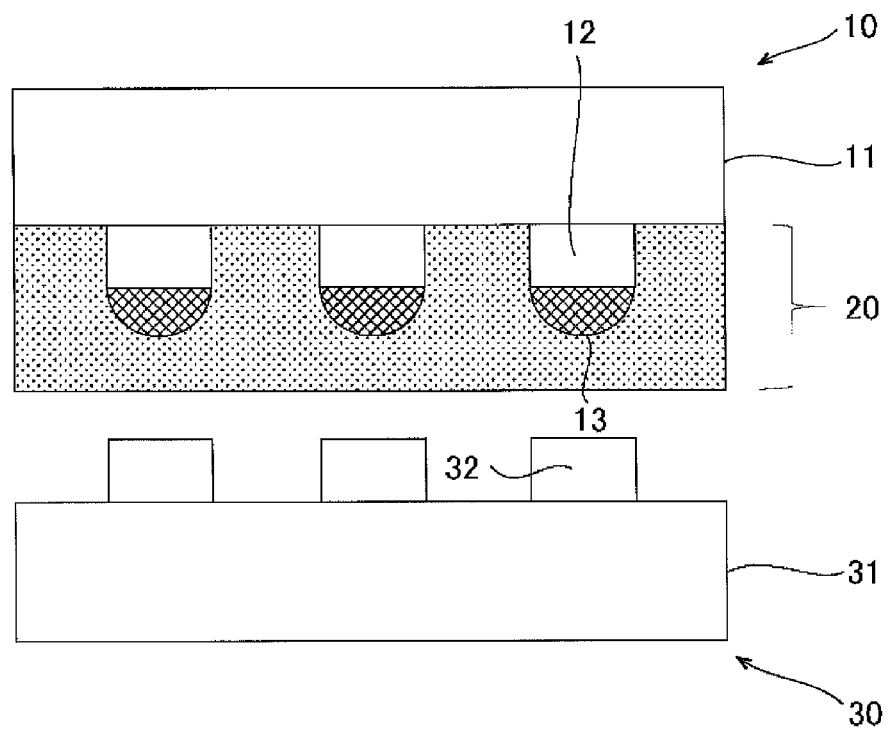
FIG. 1 is a schematic cross-sectional view illustrating a semiconductor chip and a circuit substrate before mounting.
Figure 2:
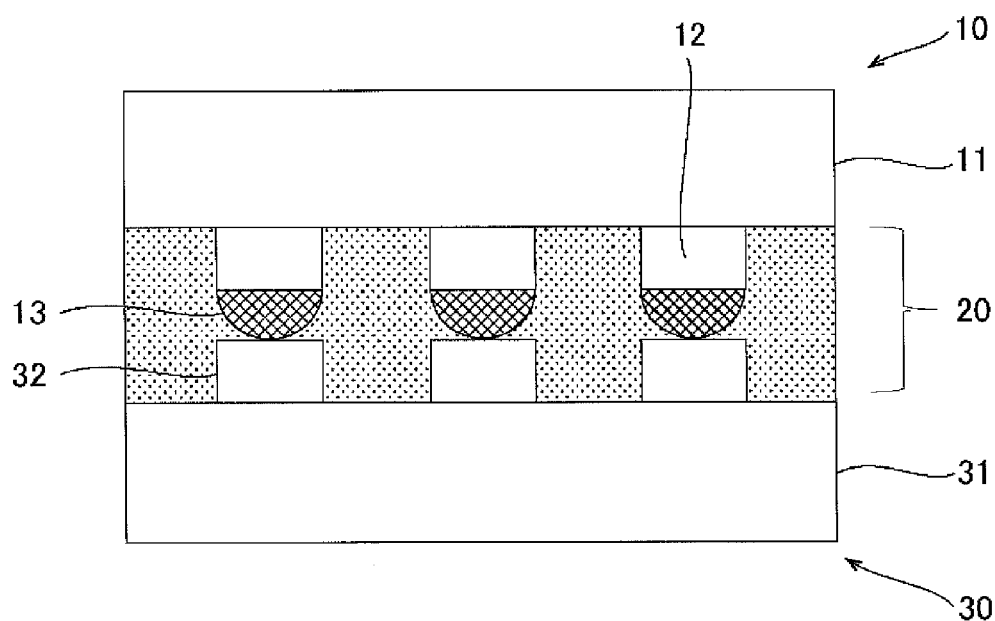
FIG. 2 is a schematic cross-sectional view illustrating the semiconductor chip and the circuit substrate at the time of mounting.
Figure 3:
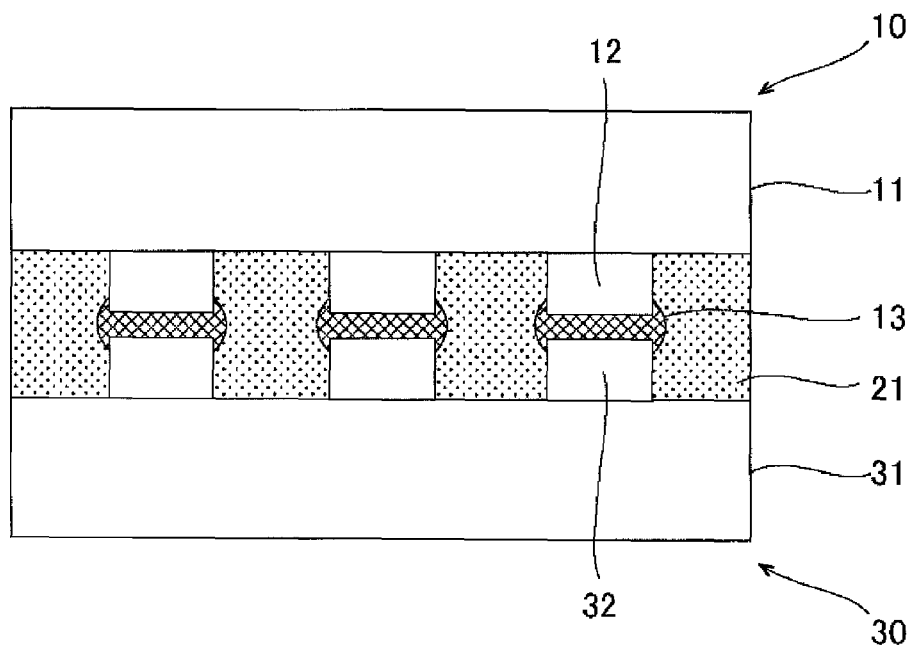
FIG. 3 is a schematic cross-sectional view illustrating the semiconductor chip and the circuit substrate after thermocompression bonding.

FIG. 1 is a cross-sectional schematic view illustrating the semiconductor chip and a circuit substrate before mounting, FIG. 2 is a cross-sectional schematic view of the semiconductor chip and the circuit substrate at the time of mounting, and FIG. 3 is a cross-sectional schematic view of the semiconductor chip and the circuit substrate after thermocompression bonding.

As illustrated in FIGS. 1 to 3, an underfill material 20 according to this embodiment is applied in advance to the electrode side of the semiconductor chip 10 having a solder-tipped electrode formed thereon, and the semiconductor chip 10 is bonded to the circuit substrate 30, on which a counter electrode facing the solder-tipped electrode has been formed, by the adhesive layer 21 formed of the cured underfill material 20.

The semiconductor chip 10 includes an integrated circuit formed on a surface of a semiconductor 11, which is formed from such materials as silicon, and an electrode with bonding-use solder called bump (referred to as solder-tipped electrode). The solder-tipped electrode includes an electrode 12 formed of copper, for example, to which a solder 13 is bonded, total thickness of the solder-tipped electrode being the combined thickness of the electrode 12 and the solder 13.

As a solder, Sn-37Pb eutectic solder (melting point: 183° C.), Sn—Bi solder (melting point: 139° C.), Sn-3.5Ag (melting point: 221° C.), Sn3.0Ag-0.5Cu (melting point: 217° C.), Sn-5.0Sb (melting point: 240° C.), among others, may be used.

The circuit substrate 30 includes a circuit formed on a substrate material 31, which is for example, a rigid substrate or a flexible substrate, among others. Additionally, a counter electrode 32 of a predetermined thickness is formed in the position(s) corresponding to the electrode(s) of the semiconductor chip on the area on which the semiconductor chip 10 is to be mounted.

The underfill material 20 includes a film-forming resin, an epoxy resin, an acid anhydride, an acrylic resin, and an organic peroxide.

The film-forming resin has a weight-average molecular weight of $10*10^4$ or higher corresponding to a high molecular weight resin, and in view of film forming properties, the weight-average molecular weight is preferably in the range of $10*10^4$ to $100*10^4$. As a film-forming resin, an acrylic rubber polymer, a phenoxy resin, an epoxy resin, a modified epoxy resin, and/or a urethane resin, among a variety of other resins, can be used. These film-forming resins may be used individually or in combinations of two or more. In this embodiment, among these film-forming resins, in view of film-strength properties and adhesive properties, an acrylic rubber polymer having a glycidyl group can preferably be used.

Examples of epoxy resin include, glycidylether type epoxy resin such as tetrakis(glycidyloxyphenyl)ethane, tetrakis(glycidyloxymethylphenyl)ethane, tetrakis(glycidyloxyphenyl)methane, tris(glycidyloxyphenyl)ethane and tris(glycidyloxyphenyl) methane, dicyclopentadiene type epoxy resin, glycidylamine type epoxy resin, bisphenol A type epoxy resin, bisphenol F type epoxy resin, bisphenol S type epoxy resin, Spiro ring type epoxy resin, naphthalene type epoxy resin, biphenyl type epoxy resin, terpene type epoxy resin, tetrabromobisphenol A type epoxy resin, cresol novolak type epoxy resin, phenol novolak type epoxy resin, α-naphthol novolak type epoxy resin, and brominated phenol novolak type epoxy resin. These epoxy resins may be used individually or in a combination of two or more. Among these, glycidylether type epoxy resin, which has a high adhesion property and heat-resisting property, is preferably used in this embodiment.

Acid anhydride can provide excellent connection reliability because its flux function removes oxide film on a solder surface. Examples of acid anhydride include alicyclic acid anhydrides such as hexahydro phthalic anhydride and methyl tetrahydro phthalic anhydride, aliphatic acid anhydrides such as tetra propenyl succinic anhydride and dodecenyl succinic anhydride, and aromatic acid anhydrides such as phthalic anhydride, trimellitic anhydride and pyromellitic anhydride. These epoxy curing agents may be used individually or in a combination of two or more. Among these, from the viewpoint of solder connectivity, alicyclic acid anhydride is preferably used.

Furthermore, curing accelerator is preferably added. Examples of the curing accelerator include 1,8-diazabicyclo (5,4,0)undecene-7 salts (DBU salt), imidazoles such as 2-methylimidazole, 2-ethylimidazole and 2-ethyl-4-methylimidazole, tertiary amines such as 2-(dimethylaminomethyl) phenol, phosphines such as triphenylphosphine, and metallic compounds such as tin octylate.

As an acrylic resin, monofunctional (meth)acrylate or polyfunctional (meth)acrylate may be used. Examples of monofunctional (meth)acrylates include methyl (meth)acrylate, ethyl (meth)acrylate, n-propyl (meth)acrylate, i-propyl (meth)acrylate and n-butyl (meth)acrylate. Examples of polyfunctional (meth)acrylate include fluorene-based acrylate, bisphenol F EO-modified di(meth)acrylate, bisphenol A EO-modified di(meth)acrylate, torimetirorlpropan PO-modified (meth)acrylate and multifunctional urethane (meth)acrylate. These acrylic resins may be used individually or in a combination of two or more. Among these, fluorene-based acrylate is preferably used in this embodiment.

Examples of organic peroxide include, peroxy ketal, peroxy ester, hydroperoxide, dialkyl peroxide, diacyl peroxide and peroxydicarbonate. These organic peroxides may be used individually or in a combination of two or more. Among these, peroxy ketal is preferably used in this embodiment.

Furthermore, an inorganic filler is preferably contained as another additive composition. The inorganic filler can regulate the fluidity of resin layers during crimping. As an inorganic filler, silica, talc, titanium oxide, calcium carbonate and magnesium oxide can be used, among others.

Moreover, epoxy-based, amino-based, mercapto-sulfide-based, and ureide-based silane coupling agent may be added as necessary.

Using an epoxy-based agent having a relatively low curing rate together with an acryl-based resin having a relatively high curing rate as described above is appropriate to bonding conditions in which temperature is increased from a first temperature to a second temperature at a predetermined rate thus enabling voidless mounting and excellent solder bonding properties.

Figure 4:
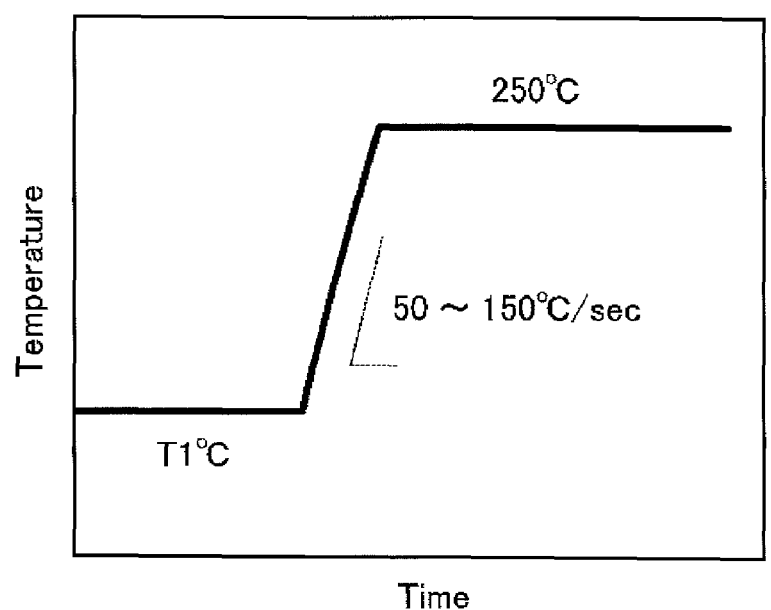
FIG. 4 is a graph showing an example of a bonding condition.

FIG. 4 is a graph illustrating one example of a bonding condition. The bonding condition is a raise in temperature from a temperature T1 to 250° C. at a rate in the range of 50° C./sec to 150° C./sec. It is preferable that the temperature T1 be the same or nearly the same as the minimum melt viscosity attainment temperature of the underfill material, the temperature T1 preferably being between 50° C. and 150° C.

Figure 5:
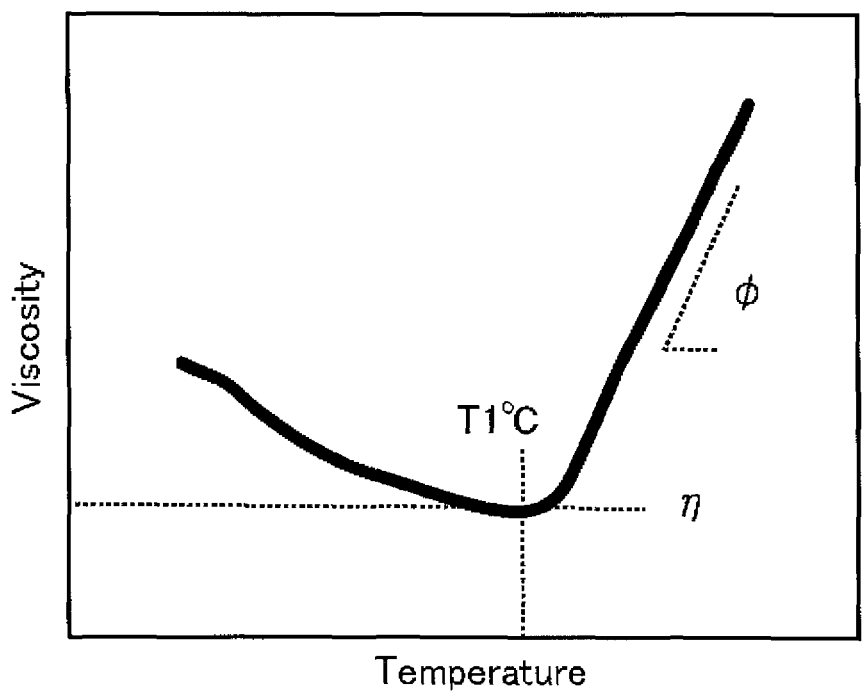
FIG. 5 is a graph showing a melt viscosity curve suitable to the bonding condition shown in FIG. 4.

FIG. 5 is a graph illustrating a melt viscosity curve of an underfill material suitable to the bonding condition illustrated in FIG. 4. The melt viscosity curve was obtained by measuring the underfill material with a rheometer under conditions of 5° C./min and 1 Hz.

The minimum melt viscosity η of the underfill material that is suitable for this bonding condition is in the range of 1000 Pa*s to 2000 Pa*s. This can suppress void generation during thermocompression bonding. Additionally, the preferable minimum melt viscosity attainment temperature of the underfill material is equal to or lower than 125° C.

Additionally, the gradient of melt point viscosity from a temperature that is 10° C. higher than the minimum melt viscosity attainment temperature of the underfill material to a temperature that is a further 10° C. higher is in the range of 900 Pa*s/° C. to 3100 Pa*s/° C. This enables voidless packaging and excellent solder connection properties under the bonding condition of a raise in temperature at a rate in a range of 5° C./sec to 150° C./sec.

Additionally, the minimum melt viscosity attainment temperature is preferably the same or nearly the same as the temperature T1 of the bonding condition. This can achieve an underfill material with behavior suitable to the bonding condition.

Additionally, the ratio between the total mass of acrylic resin and organic peroxide and the total mass of epoxy resin and acid anhydride is preferably in the range of 7:3 to 4:6. A ratio in such a range can achieve an underfill material that enables voidless packaging and excellent solder connection properties under the bonding condition of a raise in temperature at a rate in a range of 50° C./sec to 150° C./sec.

Next, a manufacturing method of a pre-applied underfill film wherein the aforementioned underfill material is formed into a film will be explained. An adhesive agent composition containing a film-forming resin, an epoxy resin, an acid anhydride, an acrylic resin and an organic peroxide is dissolved in a solvent. Toluene and ethyl acetate, among others, or a mixture of these may be used as the solvent. The prepared epoxy composition is applied to a detachable substrate material with a bar coater or other applicator.

The detachable substrate material, which has, for example, a layered structure including a release agent such as silicone, coated to a PET (poly ethylene terephthalate), OPP (oriented polypropylene), PMP (poly-4-methylpentene-1), or PTFE (polytetrafluoroethylene) material, maintains the shape of the composition, and prevents the composition from drying, Next, the epoxy composition, having been applied to the detachable substrate material, is dried by placing it into an oven or a heating and drying device, among others. Thus, a pre-applied underfill film of a predetermined thickness can be obtained.

2. Method for Manufacturing Semiconductor Device

Next, a method for manufacturing semiconductor device using the aforementioned pre-applied underfill film will be explained.

Figure 6:
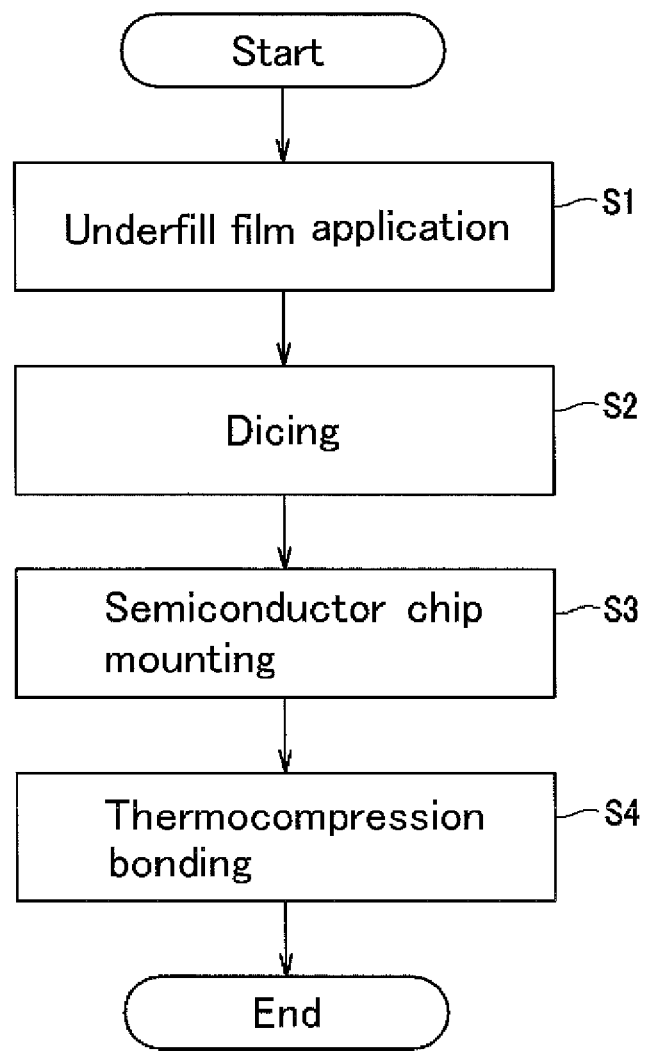
FIG. 6 is a flowchart showing a manufacturing method of a semiconductor device according to an embodiment of this invention.

FIG. 6 is a flowchart illustrating a method for manufacturing the semiconductor device according to this embodiment. As illustrated in FIG. 6, the method for manufacturing the semiconductor device according to this embodiment includes an underfill film application step S1, a dicing step S2, a semiconductor chip mounting step S3, and a thermocompression bonding step S4.

Figure 7:
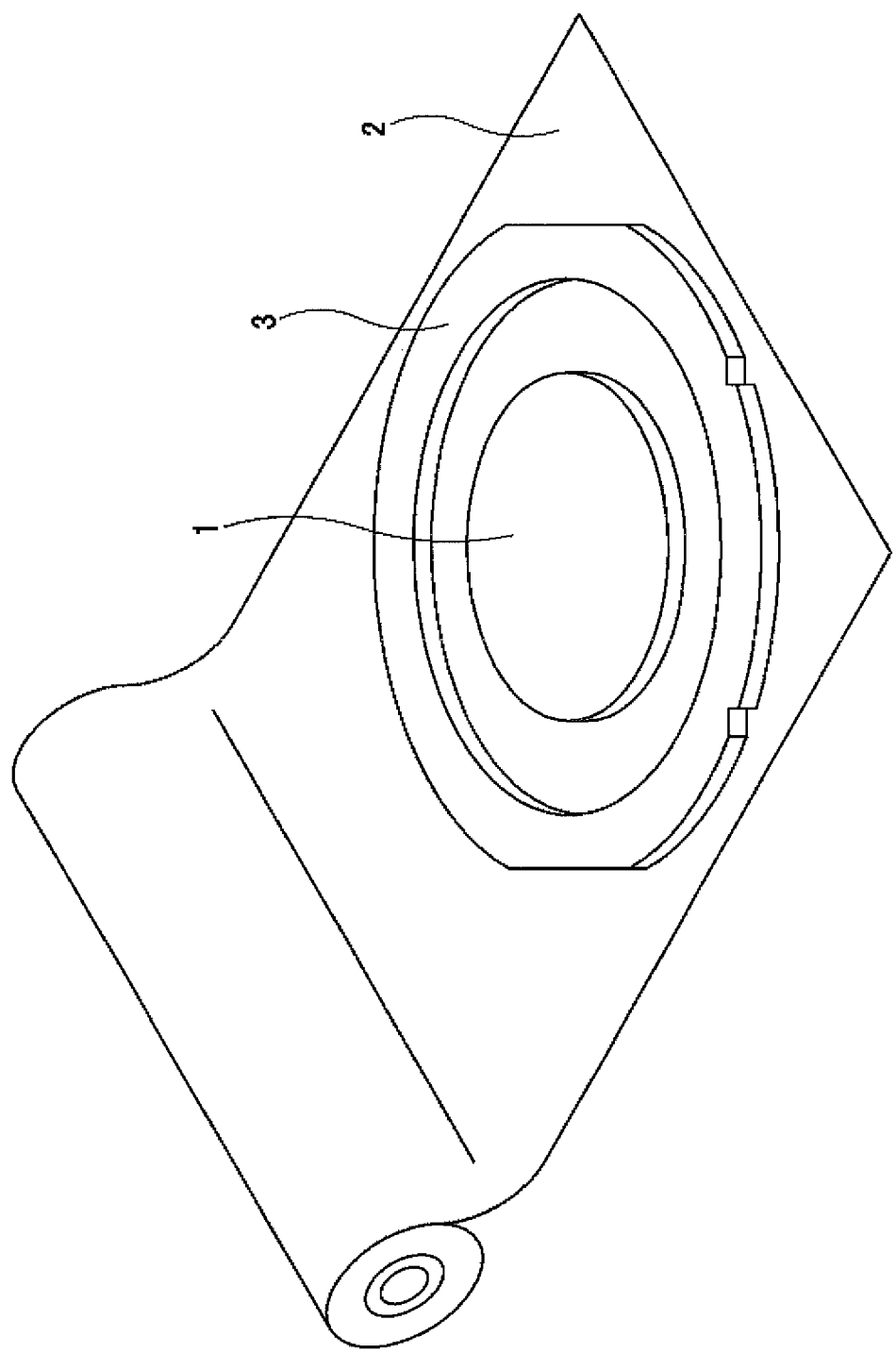
FIG. 7 is a schematic perspective view illustrating a step of applying an underfill film onto a wafer.

FIG. 7 is a schematic perspective view illustrating the step of applying the underfill film onto a wafer. As illustrated in FIG. 7, in the application step S1, a wafer 1 is secured by a jig 3 having a diameter larger than the wafer 1 and having a ring shaped or other enclosing shaped frame, and an underfill film 2 is applied onto the wafer 1. The underfill film 2 protects and secures the position of the wafer 1 during dicing and functions as a dicing tape that retains the wafer 1 during pick-up. It should be noted that a number of ICs (Integrated Circuits) are manufactured on the wafer 1; each of the semiconductor chips 10, demarked by a scribe line on the bonding side of the wafer 1, has a solder-tipped electrode(s) as shown in FIG. 1.

Figure 8:
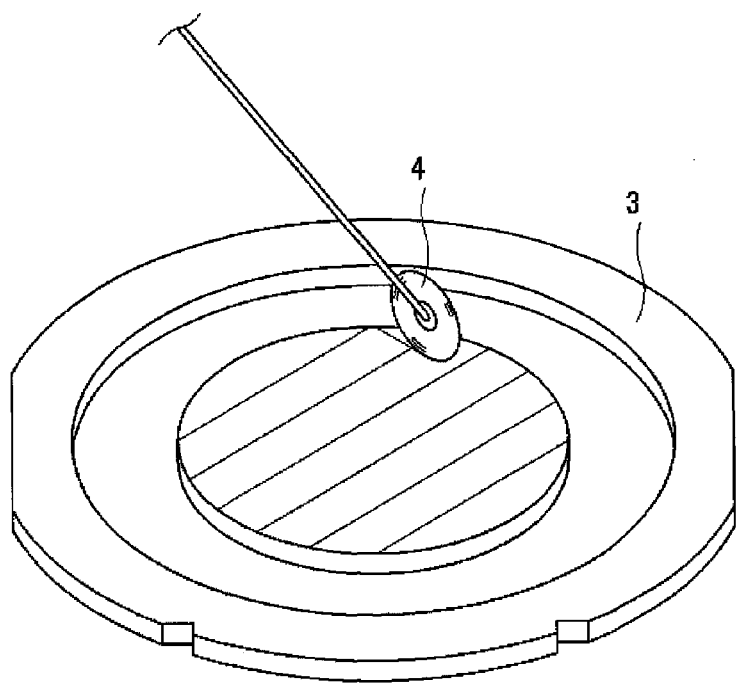
FIG. 8 is a schematic perspective view illustrating a wafer-dicing step.

FIG. 8 is a schematic perspective view illustrating the wafer-dicing step. As shown in FIG. 8, in the dicing step S2, a blade 4 is pressed along scribe lines thereby cutting the wafer 1 and the individual semiconductor chips are separated.

Figure 9:
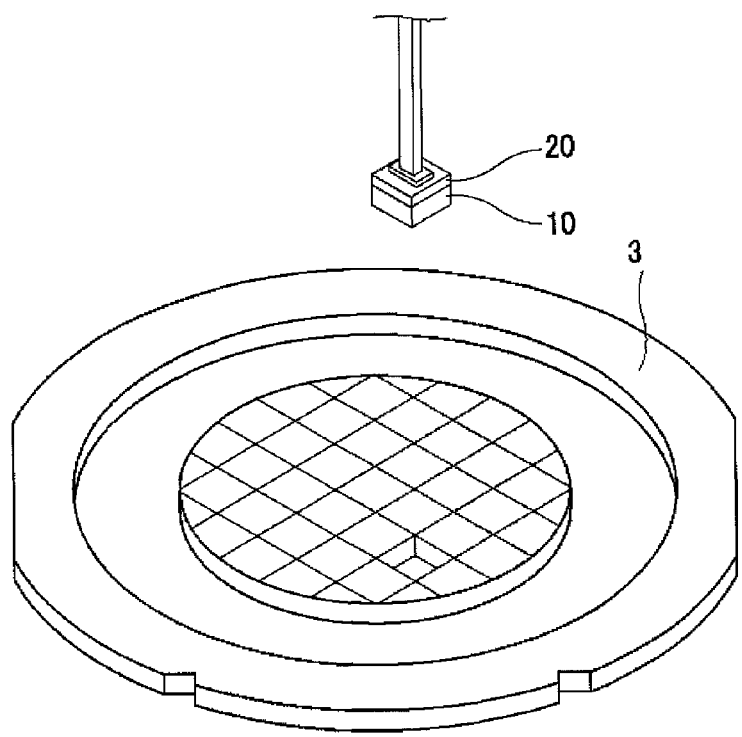
FIG. 9 is a schematic perspective view illustrating a pick-up step of a semiconductor chip.

FIG. 9 is a schematic perspective view illustrating the pick-up step of the semiconductor chip. As shown in FIG. 9, each of the semiconductor chips 10, having an underfill film, is retained by the underfill film during the pick-up.

As illustrated in FIG. 2, in the semiconductor chip mounting step S3, the semiconductor chip 10 is mounted on the circuit substrate 30 via the underfill film. Additionally, the semiconductor chip 10 with underfill film is aligned so that the solder-tipped electrode opposes the counter electrode 32. Thereinafter, thermocompression bonding is performed under predetermined conditions of temperature, pressure, and duration such that the underfill film is made flowable but not completely cured, and mounting is performed.

The temperature condition during mounting is preferably in a range of 30° C. to 155° C. Additionally, the pressure is preferably 50 N or less and more preferably 40 N or less. Additionally, the duration is preferably in a range of 0.1 sec to 10 sec and more preferably in a range of 0.1 sec to 1.0 sec. Thus, the solder-tipped electrode(s) can contact the electrode(s) of the circuit substrate 30 without melting the solder-tipped electrode(s) and the underfill film can be in a state of not being completely cured. Additionally, this fixation at a low temperature can suppress generation of voids and reduce damage to the semiconductor chip 10.

In the thermocompression bonding step S4, under the condition of raising temperature at a predetermined rate from a first temperature to a second temperature, the solder of the solder-tipped electrode is melted to form a metallic bond and the underfill film is completely cured.

The first temperature is preferably the same or nearly the same as the minimum melt viscosity attainment temperature of the underfill material and preferably in the range of 50° C. to 150° C. In this manner, curing behavior of the underfill material can be made suitable to the bonding condition and generation of voids can be suppressed.

Additionally, the rate of temperature rise is preferably in a range of 50° C./sec to 150° C./sec. Additionally, the second temperature is preferably in a range of 200° C. to 280° C. and more preferably in a range of 220° C. to 260° C., depending on the type of solder. Under these conditions, a metallic bond is formed between the solder-tipped electrode and the substrate electrode, the underfill film is completely cured, and the electrodes of the semiconductor chip 10 are electrically and mechanically connected to the electrodes of the circuit substrate 30.

Additionally, in the thermocompression bonding step S4, a height of a bonder head is maintained by the elasticity of resin until the temperature reaches the point at which the mounted underfill film starts to melt; due to resin melting in accordance with temperature rise, the bonder head rapidly descends to a lowest position. The lowest position is determined by a relation between descent speed of the bonder head and resin curing speed. After further resin curing, the height of the bonder head is gradually increased due to thermal expansion of the resin and the bonder head. In this manner, by causing the bonder head to descend to the lowest position during the temperature rise from the first temperature to the second temperature, generation of voids that occur because of resin melting can be suppressed.

As explained hereinabove, the manufacturing method of the semiconductor device in this embodiment can achieve voidless packaging and excellent solder bonding properties by applying the underfill material 20 onto a semiconductor chip 10, on which a solder-tipped electrode has been formed, since the underfill material comprises an epoxy resin, an acid anhydride, an acrylic resin and an organic peroxide, having a minimum melt viscosity in a range of 1000 Pa*s to 2000 Pa*s, gradient of melt viscosity being from a temperature 10° C. higher than the minimum melt viscosity attainment temperature to a temperature which is a further 10° C. higher and is in the range of 900 Pa*s/° C. to 3100 Pa*s/° C., in advance to the semiconductor chip 10.

It should be noted that in the embodiment described above, the underfill film functioned as a dicing tape; however, flip chip packaging may be performed using a mounting method in which another dicing tape is used and the underfill film is used after dicing.

Other Embodiments

In the hereinabove mentioned techniques, by filling pores formed on the semiconductor chip with a metal material, TSV (Through Silicon Via) techniques can be applied wherein more than one layered chip substrates in a sandwiched configuration are electrically connected.

These techniques may be applied to a manufacturing method of a semiconductor device having more than one chip substrate layers comprising a first surface having a solder-tipped electrode formed thereon and, opposite to the first surface, a second surface having a counter electrode formed thereon being opposite to the solder-tipped electrode.

In this case, with the underfill film applied to a first surface side of a first chip substrate, the first surface of the first chip substrate is mounted to a second surface of a second chip substrate. Then the first surface of the first chip substrate and the second surface of the second substrate are thermally compressed at a temperature above the melting point of the solder of the solder-tipped electrode to obtain a semiconductor device with more than one layer of chip substrates can be obtained.

3. Examples

Examples of the present invention will be explained below. In these examples, a pre-applied underfill film was manufactured, minimum melt viscosity was measured, and gradient of melt viscosity was calculated for a range of temperature from 10° C. higher than the minimum melt viscosity attainment temperature to 20° C. higher than the minimum melt viscosity attainment temperature. Package bodies were manufactured by connecting an IC chip having a solder-tipped electrode to an opposing IC substrate having a counter electrode by using the underfill films, and voids and solder bonding properties thereof were evaluated. It should be noted that the present invention is not limited by these examples.

Measurement of minimum melt viscosity and gradient of melt viscosity, package body manufacturing, void evaluation, and solder bonding properties evaluation were performed in the following Manner.

Measurement of Minimum Melt Viscosity and Calculation of Gradient of Melt Viscosity Minimum melt viscosity and minimum melt viscosity attainment temperature of each underfill film were measured by a rheometer (ARES, TA Instruments) under conditions of 5° C./min and 1 Hz. Additionally, gradient of melt viscosity was calculated over a range from 10° C. higher than the minimum melt viscosity attainment temperature to 20° C. higher than the minimum melt viscosity attainment temperature.

Manufacturing of Package Bodies

The underfill film was applied to the wafer by using a press machine under conditions of 50° C. and 0.5 Mpa and the wafer was diced to obtain an IC chip having a solder-tipped electrode.

The IC chip had a size of 7×7 mm, a thickness of 200 μm, and peripheral bumps (φ30 μm, 85 μm pitch, 280 pin) were formed thereon, each comprising a 20 μm thick Cu electrode with a 16 μm solder (Sn-3.5Ag, melting point: 221° C.) applied to the tip thereof.

Similarly, the IC substrate opposing the IC chip had a size of 7×7 mm, a thickness of 200 μm and peripheral bumps (φ30 μm, 85 μm pitch, 280 pin) formed thereon, each comprising a 20 μm thick Cu electrode.

Then, the IC chip was mounted onto the IC substrate by using a flip chip bonder under a condition of 60° C., 5 sec, and 30 N.

Subsequently, as illustrated by the bonding condition in FIG. 4, thermocompression bonding was conducted by using the flip chip bonder at a rate of temperature increase of 50° C./sec from minimum melt viscosity attainment temperature of the underfill film to 250° C. Additionally, the bonder head was lowered with a force of 30 N to the lowest position during the time of temperature increase from the minimum melt viscosity attainment temperature to 250° C. Furthermore, curing was performed under a condition of 150° C. for 2 hours to obtain a first package body. Similarly, thermocompression bonding was performed under a condition of a rise in temperature from the minimum melt viscosity attainment temperature of the underfill film to 250° C. at a rate of 150° C./sec and curing was performed to obtain a second package body. It should be noted that the actual temperatures of the samples were measured with a thermocouple during use of the flip chip bonder.

Evaluation of Voids

The first package body, obtained by thermocompression bonding under a condition of a rise in temperature at a rate of 50° C./sec and the second package body, obtained by thermocompression bonding under a condition of a rise in temperature at a rate of 150° C./sec, were observed by using an SAT (Scanning Acoustic Tomography). Cases in which voids were not generated in both the first package body and the second package body were evaluated as "good" (represented as G, in Table 1) and cases in which voids are generated in either were evaluated as "bad" (represented as B, in Table 1). In general, voids might adversely affect long-term reliability.

Evaluation of Solder Bonding Properties

After samples of the first package body, obtained by thermocompression bonding under a condition of a rise in temperature at a rate of 50° C./sec and samples of the second package body, obtained by thermocompression bonding under a condition of a rise in temperature at a rate of 150° C./sec, were cut and the cut sections were polished, state of the solder between the IC chip electrodes and the IC substrate electrodes was observed by using an SEM (Scanning Electron Microscope). Cases in which both the first package and the second package were observed to have both good solder connections and solder wetting were evaluated as good (G) and cases in which either package was observed to have either insufficient solder connections or insufficient solder wetting were evaluated as bad (B).

Example 1

A 70/30 acrylic/epoxy resin composition used as the film forming resin was prepared by blending an acrylic rubber polymer (Teisan Resin SG-P3, Nagase chemteX Corporation) as a film forming resin at 40 pts. mass, an epoxy resin (JER1031S, Mitsubishi Chemical Corporation) at 20 pts. mass, an acid anhydride (RIKACID HNA-100, New Japan Chemical Co., Ltd.) at 10 pts. mass, an imidazole (IJ-CAT-5002, San-Apro Ltd.) as a curing accelerator at 1 pts. mass, an acrylic resin (OGSOL EA-0200, Osaka Gas Chemicals Co., Ltd.) at 68 pts. mass, an organic peroxide (PERHEXA V, NOF CORPORATION) at 2 pts. mass, and a filler (AEROSIL R202, NIPPON AEROSIL CO., LTD) at 15 pts. mass. This composition was applied to a PET (polyethylene terephthalate) material treated to be detachable by using a bar coater and dried in an oven under conditions of 80° C. for 3 min to manufacture the underfill film, having a thickness of 50 μm (detachable cover PET (25 μm)/underfill film (50 μm)/detachable base PET (50 μm)).

Figure 10:
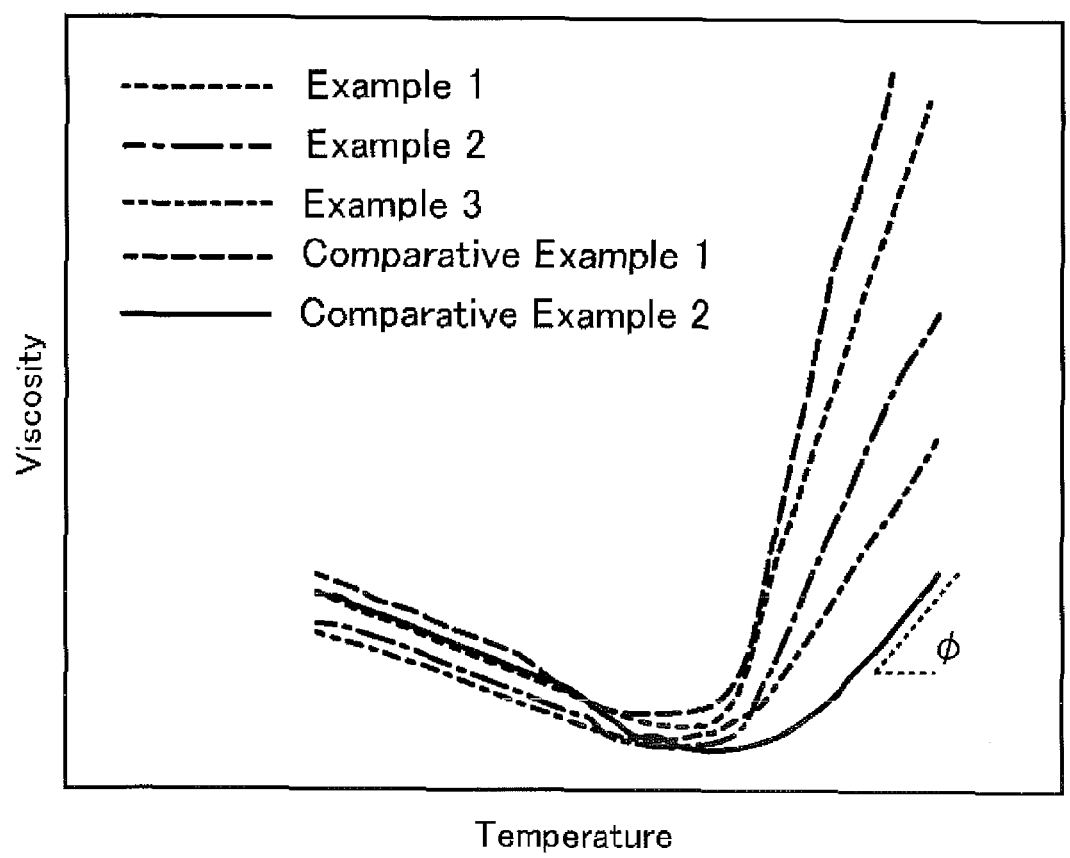
FIG. 10 is a graph showing a melt viscosity curve of a sample underfill material.

The melt viscosity curve of the underfill film of Example 1 is shown in FIG. 10. Additionally, evaluation results of the underfill film of Example 1 are shown in Table 1. The minimum melt viscosity of the underfill film was 1490 Pa*s and the minimum melt viscosity attainment temperature was 113° C. Additionally, the gradient φ of melt viscosity at the temperatures in a range of 123° C. to 133° C. was 3100 Pa*s/° C. Additionally, in package bodies manufactured by using this underfill film, voids were evaluated as good (G) and solder bonding was also evaluated as good (G).

Example 2

A 50/50 acrylic/epoxy resin composition used as the film forming resin was prepared by blending an acrylic rubber polymer (Teisan Resin SG-P3, Nagase chemteX Corporation) as a film forming resin at 40 pts. mass, an epoxy resin (JER1031S, Mitsubishi Chemical Corporation) at 30 pts. mass, an acid anhydride (RIKACID HNA-100, New Japan Chemical Co., Ltd.) at 20 pts. mass, an imidazole (U-CAT-5002, San-Apro Ltd.) as a curing accelerator at 1 pts. mass, an acrylic resin (OGSOL EA-0200, Osaka Gas Chemicals Co., Ltd.) at 49 pts. mass, an organic peroxide (PERHEXA V, NOF CORPORATION) at 1 pts. mass, and a filler (AEROSIL R202, NIPPON AEROSIL CO., LTD) at 15 pts. mass. This composition was applied to a PET (polyethylene terephtalate) material treated to be detachable by using a bar coater and dried in an oven under conditions of 80° C. for 3 min to manufacture the underfill film, having a thickness of 50 μm (detachable cover PET (25 μm)/underfill film (50 μm)/detachable base PET (50 μm)).

The melt viscosity curve of the underfill film of Example 2 is shown in FIG. 10. Additionally, evaluation results of the underfill film of Example 2 are shown in Table 1. The minimum melt viscosity of the underfill film was 1330 Pa*s and the minimum melt viscosity attainment temperature was 112° C. Additionally, the gradient φ of melt viscosity at the temperatures in a range of 122° C. to 132° C. was 1700 Pa*s/° C. Additionally, in package bodies manufactured by using this underfill film, voids were evaluated as good (G) and solder bonding was also evaluated as good (G).

Example 3

A 50/50 acrylic/epoxy resin composition used as the film forming resin was prepared by blending an acrylic rubber polymer (Teisan Resin SG-P3, Nagase chemteX Corporation) as a film forming resin at 40 pts. mass, an epoxy resin (JER1031S, Mitsubishi Chemical Corporation) at 45 pts. mass, an acid anhydride (RIKACID HNA-100, New Japan Chemical Co., Ltd.) at 15 pts. mass, an imidazole (U-CAT-5002, San-Apro Ltd.) as a curing accelerator at 1 pts. mass, an acrylic resin (OGSOL EA-0200, Osaka Gas Chemicals Co., Ltd.) at 39 pts. mass, an organic peroxide (PERHEXA V, NOF CORPORATION) at 1 pts. mass, and a filler (AEROSIL R202, NIPPON AEROSIL CO., LTD) at 15 pts. mass. This composition was applied to a PET (polyethylene terephthalate) material treated to be detachable by using a bar coater and dried in an oven under conditions of 80° C. for 3 min to manufacture the underfill film, having a thickness of 50 μm (detachable cover PET (25 μm)/underfill film (50 μm)/detachable base PET (50 μm)).

The melt viscosity curve of the underfill film of Example 3 is shown in FIG. 10. Additionally, evaluation results of the underfill film of Example 3 are shown in Table 1. The minimum melt viscosity of the underfill film was 1390 Pa*s and the minimum melt viscosity attainment temperature was 113° C. Additionally, the gradient φ of melt viscosity at the temperatures in a range of 123° C. to 133° C. was 900 Pa*s/° C. Additionally, in package bodies manufactured by using this underfill film, voids were evaluated as good (G) and solder bonding was also evaluated as good (G).

Comparative Example 1

An 80/20 acrylic/epoxy resin composition used as the film forming resin was prepared by blending an acrylic rubber polymer (Teisan Resin SG-P3, Nagase chemteX Corporation) as a film forming resin at 40 pts. mass, an epoxy resin (JER1031S, Mitsubishi Chemical Corporation) at 13 pts. mass, an acid anhydride (RIKACID HNA-100, New Japan Chemical Co., Ltd.) at 7 pts. mass, an imidazole (U-CAT-5002, San-Apro Ltd.) as a curing accelerator at 1 pts. mass, an acrylic resin (OGSOL EA-0200, Osaka Gas Chemicals Co., Ltd.) at 76 pts. mass, an organic peroxide (PERHEXA V, NOF CORPORATION) at 4 pts. mass, and a filler (AEROSIL 8202, NIPPON AEROSIL CO., LTD) at 15 pts. mass. This composition was applied to a PET (polyethylene terephthalate) material treated to be detachable by using a bar coater and dried in an oven under conditions of 80° C. for 3 min to manufacture the underfill film, having a thickness of 50 μm (detachable cover PET (25 μm)/underfill film (50 μm)/detachable base PET (50 μm)).

The melt viscosity curve of the underfill film of Comparative Example 1 is shown in FIG. 10. Additionally, evaluation results of the underfill film of Comparative Example 1 are shown in Table 1. The minimum melt viscosity of the underfill film was 1950 Pa*s and the minimum melt viscosity attainment temperature was 113° C. Additionally, the gradient 4) of melt viscosity at the temperatures in a range of 123° C. to 133° C. was 4000 Pa*s/° C. Additionally, in package bodies manufactured by using this underfill film, voids were evaluated as good (G) and solder bonding was evaluated as bad (B).

Comparative Example 2

An 30/70 acrylic/epoxy resin composition used as the film forming resin was prepared by blending an acrylic rubber polymer (Teisan Resin SG-P3, Nagase chemteX Corporation) as a film forming resin at 40 pts. mass, an epoxy resin (JER1031S, Mitsubishi Chemical Corporation) at 40 pts. mass, an acid anhydride (RIKACID HNA-100, New Japan Chemical Co., Ltd.) at 30 pts. mass, an imidazole (U-CAT-5002, San-Apro Ltd.) as a curing accelerator at 1 pts. mass, an acrylic resin (OGSOL EA-0200, Osaka Gas Chemicals Co., Ltd.) at 29 pts. mass, an organic peroxide (PERHEXA V, NOF CORPORATION) at 1 pts. mass, and a filler (AEROSIL R202, NIPPON AEROSIL CO., LTD) at 15 pts. mass. This composition was applied to a PET (polyethylene terephthalate) material treated to be detachable by using a bar coater and dried in an oven under conditions of 80° C. for 3 min to manufacture the underfill film, having a thickness of 50 μm (detachable cover PET (25 μm)/underfill film (50 μm)/detachable base PET (50 μm)).

The melt viscosity curve of the underfill film of Comparative Example 2 is shown in FIG. 10. The melt viscosity curve of the underfill film of Comparative Example 2 is shown in FIG. 10. The minimum melt viscosity of the underfill film was 1300 Pa*s and the minimum melt viscosity attainment temperature was 115° C. Additionally, the gradient φ of melt viscosity at the temperatures in a range of 125° C. to 135° C. was 400 Pa*s/° C. Additionally, in package bodies manufactured by using this underfill film, voids were evaluated as bad (B) and solder bonding was evaluated as good (G).

TABLE 1

| Classification | Product Name | Ex. 1 | Ex. 2 | Ex. 3 | Com. 1 | Com. 2 |
|---|---|---|---|---|---|---|
| Film forming resin | Teisan Resin SG-P3 (Nagase chemteX) | 40 | 40 | 40 | 40 | 40 |
| Acrylic resin | OGSOL EA-0200 (Osaka Gas Chemicals) | 68 | 49 | 39 | 76 | 29 |
| Organic peroxide | PERHEXA V (NOF CORPORATION) | 2 | 1 | 1 | 4 | 1 |
| Epoxy resin | JER 1031S (Mitsubishi Chemical) | 20 | 30 | 45 | 13 | 40 |
| Acid anhydride | RIKACID HNA-100 (New Japan Chemical) | 10 | 20 | 15 | 7 | 30 |
| Curing accelerator | U-CAT-5002 (San-Apro) | 1 | 1 | 1 | 1 | 1 |
| Filler | AEROSIL R202 (NIPPON AEROSIL) | 15 | 15 | 15 | 15 | 15 |
| Total | | 156 | 156 | 156 | 156 | 156 |
| Acryl ratio | | 70 | 50 | 40 | 80 | 30 |
| Epoxy ratio | | 30 | 50 | 60 | 20 | 70 |
| Minimum melt viscosity [Pa·s] | | 1490 | 1330 | 1390 | 1950 | 1300 |
| Minimum melt viscosity attainment temperature [° C.] | | 113 | 112 | 113 | 113 | 115 |
| Gradient Ø of melt viscosity [Pa·s/° C.] | | 3100 | 1700 | 900 | 4000 | 400 |
| Voids | | G | G | G | G | B |
| Solder bonding state | | G | G | G | B | G |

Voidless bonding is possible in such cases as Comparative Example 1 wherein the gradient of melt viscosity exceeds 3100 Pa*s/° C.; however, solder bonding defects occurred in both the first package body which was thermally compressed at a rate of temperature increase of 50° C./s and the second package body which was thermally compressed at a rate of temperature increase of 150° C./sec. Additionally, solder bonding was satisfactory in such cases as Comparative Example 2; however, voids occurred in the second package body which was thermally compressed at a rate of temperature increase of 150° C./sec.

In contrast, voidless bonding and excellent solder bonding were achievable in cases such as Examples 1 to 3 wherein bonding conditions were a gradient φ of melt viscosity in a range from 900 Pa*s/° C. to 3100 Pa*s/° C. and a rate of temperature increase in a range from 50° C./sec and 150° C./sec.

Reference Signs List 1 wafer, 2 underfill film, 3 jig, 4 blade, 10 semiconductor chip, 11 semiconductor, 12 electrode, 13 solder, 20 underfill material, 21 first adhesive layer, 22 second adhesive layer, 30 circuit substrate, 31 substrate material, 32 counter electrode

The invention claimed is:

1. A method for manufacturing a semiconductor device comprising:
   a mounting step of mounting a semiconductor chip onto an electronic component, the semiconductor chip having a solder-tipped electrode formed thereon and an underfill material applied to the surface of the solder-tipped electrode, and the electronic component having a counter electrode facing the solder-tipped electrode, and
   a thermocompression bonding step of thermally compressing the semiconductor chip and the electronic component by increasing a temperature at a predetermined rate from a first temperature to a second temperature, wherein
   the underfill material contains an epoxy resin, a curing accelerator, a (meth)acrylate resin and an organic peroxide, the minimum melt viscosity of the underfill material ranges from 1000 Pa*s to 2000 Pa*s, and the gradient of the melt viscosity from a temperature 10° C. higher than a minimum melt viscosity attainment temperature to a temperature 10° C. higher than the temperature ranges 900 Pa*s/° C. to 3100 Pa*s/° C.

2. The method for manufacturing a semiconductor device according to claim 1, wherein the first temperature is approximately the same as the minimum melt viscosity attainment temperature.

3. The method for manufacturing a semiconductor device according to claim 1, wherein
   the first temperature ranges from 50° C. to 150° C., and the rate of the temperature increase ranges from 50° C./sec to 150° C./sec.

4. The method for manufacturing a semiconductor device according to claim 3, wherein
   the underfill material contains an epoxy curing agent, and a ratio of the total mass of the (meth)acrylate resin and the organic peroxide, and the total mass of the epoxy resin and the epoxy curing agent ranges from 7:3 to 4:6.

* * * * *